United States Patent [19]

Milan

[11] Patent Number: 5,092,774

[45] Date of Patent: Mar. 3, 1992

[54] MECHANICALLY COMPLIANT HIGH FREQUENCY ELECTRICAL CONNECTOR

[75] Inventor: James E. Milan, Buxton, Me.

[73] Assignee: National Semiconductor Corporation, Santa Clara, Calif.

[21] Appl. No.: 639,586

[22] Filed: Jan. 9, 1991

[51] Int. Cl.⁵ .............................................. H01R 9/09
[52] U.S. Cl. ................................. 439/66; 324/158 F; 439/378; 439/482
[58] Field of Search .................. 439/86, 91, 912, 482, 439/66, 74, 65, 378; 324/158 P, 158 F

[56] References Cited

U.S. PATENT DOCUMENTS

| | | | |
|---|---|---|---|
| 4,692,790 | 9/1987 | Oyamada | 439/331 |
| 4,721,908 | 1/1988 | Driller et al. | 324/158 P |
| 4,769,591 | 9/1988 | Binet et al. | 324/158 F |
| 4,833,402 | 5/1989 | Boegh-Petersen | 324/158 F |
| 4,870,356 | 9/1989 | Tingley | 324/158 F |

FOREIGN PATENT DOCUMENTS 1349786  4/1974  United Kingdom ................ 439/482

Primary Examiner—Neil Abrams
Attorney, Agent, or Firm—James W. Rose; Daniel H. Kane

[57] ABSTRACT

An electrical connector (10) provides a mechanical coupling and an electrical interface between circuit boards (12,14). An elastomeric electrical conductor (20) provides compressible electrical connector paths between first and second sets of electrical contact pads (28,15) coupled to the respective circuit boards. A compression mounting assembly (22) aligns and retains the elastomeric electrical conductor (20) between the sets of electrical contact pads. The elastomeric electrical conductor (20) affords relatively high frequency signal conducting paths with substantially constant impedance for example for passing test signals and pin signals without distortion between circuit boards in the test head of an IC device tester. A mechanical spring system (64,65) spring loads the compression mounting assembly (22) and provides a relatively high mechanical compliance coupling between circuit boards (12,14) to accommodate relative change of position of the boards due to misalignment or board warpage. The electrical connector (10) is used for example between the pin electronics cards (12) and the IC device under test loadboard (14) in the test head of IC device testers for testing high speed ECL devices.

28 Claims, 3 Drawing Sheets

MECHANICALLY COMPLIANT HIGH FREQUENCY ELECTRICAL CONNECTOR

CROSS REFERENCE TO RELATED PATENT APPLICATION

This patent application is related to U.S. Pat. Application Ser. No. 07/639,823 filed on the same date and entitled PIN ELECTRONICS TEST CIRCUIT FOR IC DEVICE TESTING, inventor William H. Morong III. Both patent applications are assigned to a common assignee.

FIELD OF THE INVENTION

This invention relates to a new electrical connector which provides a mechanical coupling and an electrical interface between circuit boards. The electrical connector provides relatively high frequency signal conducting electrical connections over controlled impedance paths between sets of electrical contact pads coupled to the respective circuit boards. The electrical connector also affords a high mechanical compliance coupling between the circuit boards to accommodate relative change of position of the circuit boards caused by warpage or misalignment. The invention is particularly applicable for connecting an IC device under test (DUT) loadboard to pin electronics cards (PEC's) in an IC device tester to provide a substantially constant impedance paths for testing high speed ECL devices.

BACKGROUND ART

In IC device testers the IC device under test (DUT) is typically inserted in a dedicated socket fixed on a DUT loadboard which is formed with printed circuit leads to the pins of the DUT. Different DUT loadboards with different socket sizes are provided for accommodating the different types of DUT packages to be tested. The different loadboards are interchangeably mounted or installed on pin electronics cards (PEC's) in the test head of the IC device tester. The appropriate loadboard is selected for testing the DUT according to the DUT package style and size.

The pin electronics cards deliver test signals to the respective pins of a DUT mounted on a DUT loadboard and receive resulting pin signals for measurement and testing. These test signals and pin signals must pass through electrical connectors between the PEC's and DUT loadboard. PEC's are typically arranged vertically in a radial array on the "motherboard" of the test head, at least one PEC for each pin of the DUT. The selected DUT loadboard is installed, for example, horizontally on top of the radial array of vertical PEC's.

The electrical connectors are generally secured to the PEC's and join the DUT loadboard to the PEC array. The electrical connectors provide an electrical interface with continuity of test signal and pin signal electrical paths between the PEC's and DUT loadboard for passing test signals and pin signals between the PEC's and the pins of a DUT inserted into the IC device socket on the loadboard. The electrical connectors also provide a physical joinder for mechanically mounting and installing the DUT loadboard on the PEC's. The electrical connectors therefore perform a dual function in providing both an electrical interface and mechanical coupling. They are preferably designed to permit convenient interchangeability of the DUT loadboards.

One type of prior art electrical connector for the DUT loadboard/PEC interface used printed circuit card edge or circuit board edge connectors. Such card edge connectors however are subject to mechanical wear and require excessive mating force to engage the complementary edge connectors.

Another PEC to DUT loadboard electrical connector uses spring loaded contacts at the PEC/DUT loadboard interface. The spring provides both the electrical interface and the mechanical coupling between circuit boards. This system of interconnection provides a mechanical coupling with sufficient mechanical compliance to accommodate relative change of position of the circuit boards due to misalignment and board warpage. An example of such spring loaded contact interconnects are the so called "Pogo" (TM) electrical connectors and contacts manufactured by Augat, Inc., 33 Perry Avenue, Attleboro, Mass. 02703, and used for example, in the MCT 2000 R (TM) series IC device test systems.

A disadvantage of such spring loaded contact electrical interconnects is that the spring is inductive, and the inductance of the spring varies with spring tension and displacement. It is therefore difficult to maintain a constant impedance path for the test signals and pin signals. Undesirable distortion is introduced into the test measurements particularly for high frequency signals characteristic of current high speed ECL devices.

A third type of PEC to DUT loadboard interconnect uses elastomeric conductors or metal layer conductors over elastomeric spacers to provide the electrical interface and electrical connections between the PEC's and DUT loadboard. Such an electrical interconnect maintains substantially constant impedance over the test signal and pin signal electrical paths for measurement of high frequency signals without substantial distortion. A disadvantage of this electrical connector however, is that it affords only limited mechanical compliance and cannot accommodate the relative change of position in the PC boards caused by significant warpage or misalignment.

OBJECTS OF THE INVENTION

It is therefore an object of the present invention to provide a new electrical connector for joining circuit boards with an electrical interface of controlled impedance. The electrical connector affords high frequency signal conducting paths of substantially constant impedance for passing signals without introducing significant distortion.

Another object of the invention is to provide an electrical connector for joining circuit boards with a relatively high mechanical compliance. The mechanical coupling accommodates relative change of position of the circuit boards caused, for example, by significant board warpage or misalignment. Alignment of the electrical connection paths is also maintained.

A further object of the invention is to provide an electrical connector for joining a DUT loadboard to PEC's in the test head of an IC device tester particularly applicable for testing high speed ECL devices. The electrical connector provides a controlled impedance path for test measurements without introducing significant distortion in high frequency test signals and pin signals.

DISCLOSURE OF THE INVENTION

In order to accomplish these results the invention provides an electrical connector for making electrical connections between first and second sets of electrical contact pads coupled respectively to first and second circuit boards. An elastomeric electrical conductor provides a first set of relatively high frequency signal conducting compressible electrical connector paths between the first and second sets of electrical contact pads. A compression mounting assembly mounts and retains the elastomeric electrical conductor between the first and second sets of electrical contact pads.

According to the invention a mechanical spring system is coupled to the electrical connector for spring loading the compression mounting assembly for compressing the elastomeric electrical conductor between the first and second sets of electrical contact pads. The mechanical spring system affords a relatively high mechanical compliance coupling between the first and second circuit boards in combination with the elastomeric electrical conductor for maintaining electrical connection through the compressible electrical connector paths over a range of relative change of position of the first and second circuit boards.

A feature of the invention is that the elastomeric electrical conductor establishes relatively low inductance and substantially constant impedance compressible electrical connector paths between the respective sets of electrical contact pads. Furthermore the elastomeric material provides good electrical contacts at the pads. An advantage of the mechanical spring system in series with the elastic elastomeric conductor is that the high mechanical compliance assures continuity of the compressible electrical paths despite warpage or misalignment of the circuit boards.

The invention also incorporates an alignment system with the electrical connector. The electrical connector is secured to the first circuit board at a fixed position and is constructed with first alignment structures such as alignment pins. The second circuit board is formed with second alignment structures such as alignment holes complementary to the alignment pins of the electrical connector for alignment of the first set of electrical contact pads, first set of compressible electrical connector paths, and second set of electrical contact pads for making the desired electrical connections.

In the preferred example the first set of electrical contact pads are formed on a third circuit board separate from the first circuit board. The first set of electrical contact pads are then coupled to the first circuit board by transmission line couplings such as coaxial cables. The third circuit board is formed with third alignment structures such as further alignment holes also complementary with the alignment pins of the electrical connector for maintaining the alignment of the first and second sets of electrical contact pads.

The compression mounting assembly includes a compression stop holder for holding the elastomeric electrical conductor and for limiting compression of the elastomeric conductor. A floating spring loaded block is mechanically coupled to the compression stop holder. Mechanical springs coupled to the spring loaded block spring bias the block and in turn the compression stop holder for compressing the elastomeric conductor between the first and second sets of electrical contact pads. The third circuit board is interposed between the compression stop holder and spring loaded block. The compression stop holder is formed in an annular configuration exposing the elastomeric electrical conductor at both ends of the compression stop holder for contacting the first set of electrical contact pads formed on the third circuit board and for contacting the second set of electrical contact pads, for example formed on the second circuit board.

In the preferred construction of the compression mounting assembly, the compression stop holder is formed with alignment holes and the spring loaded block is formed with alignment channels for alignment with the alignment pins of the electrical connector. The elongate alignment channels pass through the spring loaded block from one end to the other. Fixed pins of the electrical connector are secured in stationary position on the first circuit board at one end of the fixed pins. The other ends of the fixed pins extend into one end of the elongate alignment channels so that the compression mounting assembly is movably seated over the fixed pins. The alignment pins of the electrical connector are secured in stationary position in the other ends of the elongate alignment channels. The fixed pins at one end of the alignment channels and the alignment pins at the other ends of the alignment channels define elongate spaces within the spring loaded block. The mechanical springs in the form of helical springs are seated in the elongate spaces between the respective fixed pins and alignment pins.

As a result the spring loaded block and therefore the entire compression mounting assembly are movably mounted on the fixed pins and spring loaded relative to the first circuit board for relatively high mechanical compliance. The alignment pins of the electrical connector extend into the alignment holes of the second circuit board. The movability and clearance of the compression mounting assembly relative to the fixed pins and the mechanical compliance of the springs accommodates warpage or misalignment of the circuit boards while maintaining substantially constant impedance electrical paths between the aligned sets of electrical contact pads.

According to the invention the first and second sets of electrical contact pads are printed circuit traces in configurations approximating the "footprints" in two dimensions of coaxial cable transmission lines for providing controlled impedance throughout the electrical connection made by the electrical connector. In the preferred example the first and second sets of electrical contact pads are formed with a "U" shaped pad for ground electrical connection, a first elongate line shaped pad within the "U" shaped pad, and a second elongate line shaped pad adjacent to the "U" shaped pad. The first and second elongate line shaped pads provide the test signal and pin signal electrical path connections.

Furthermore third and fourth sets of electrical contact pads may be coupled respectively to the first and second circuit boards separate from the first and second sets of electrical contact pads. Coaxial cable transmission line footprints may also be used for the pad configurations. The elastomeric electrical conductor provides a second set of compressible electrical connector paths between the third and fourth sets of electrical contact pads separate from the first set of compressible electrical connector paths. A feature of this arrangement is that separate test electrical paths are provided for example for testing high speed ECL IC devices in the bus mode and in the differential output or complementary mode.

The invention is applied in the test head of a digital logic IC device tester for making electrical connections between the pin electronics cards and an IC DUT loadboard. In this application a PEC corresponds to the first circuit board while a DUT loadboard corresponds to the second circuit board.

Other objects, features and advantages of the invention are apparent in the following specification and accompanying drawings.

DESCRIPTION OF PREFERRED EXAMPLE EMBODIMENTS & BEST MODE OF THE INVENTION

Figure 1:
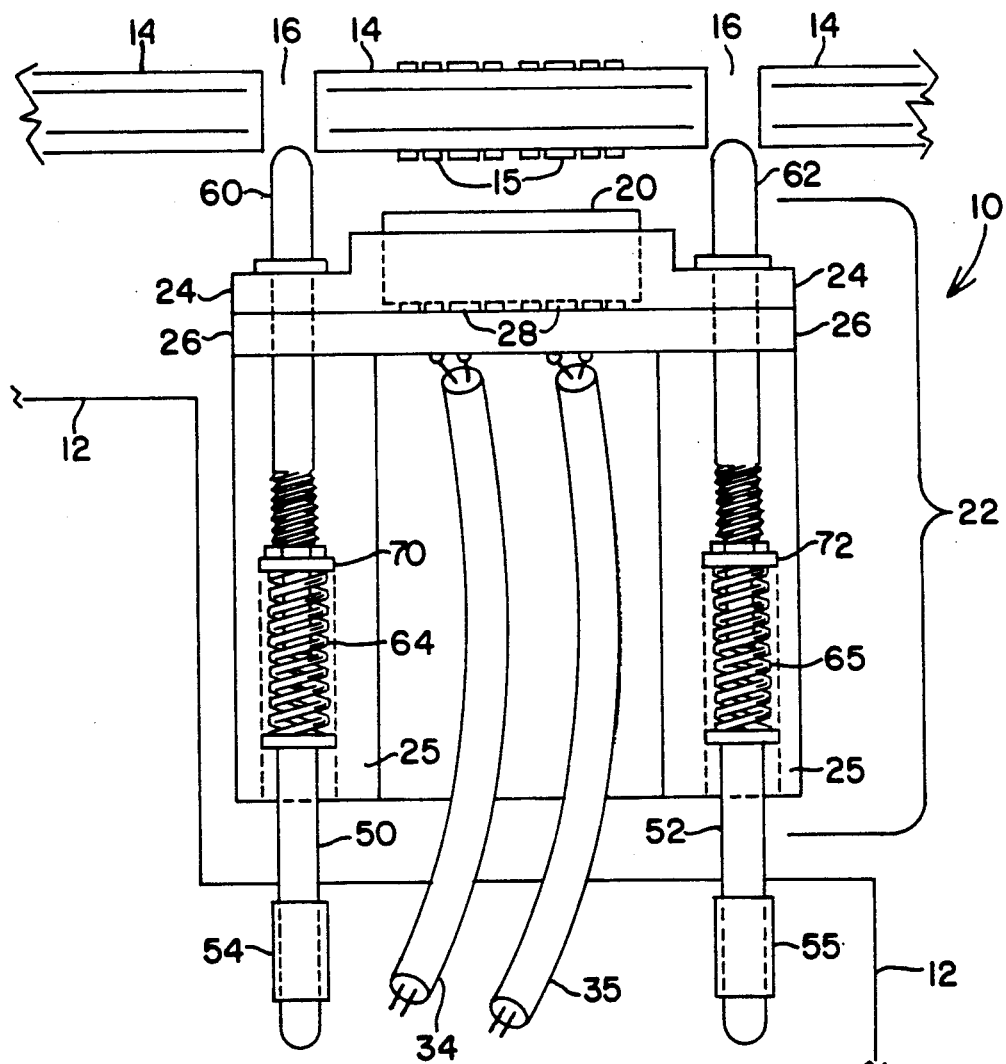
FIG. 1 is a diagrammatic fragmentary environmental side view of the electrical connector partially cutaway to reveal internal parts and showing the electrical connector coupled between a horizontal DUT loadboard and a vertical PEC.
Figure 2:
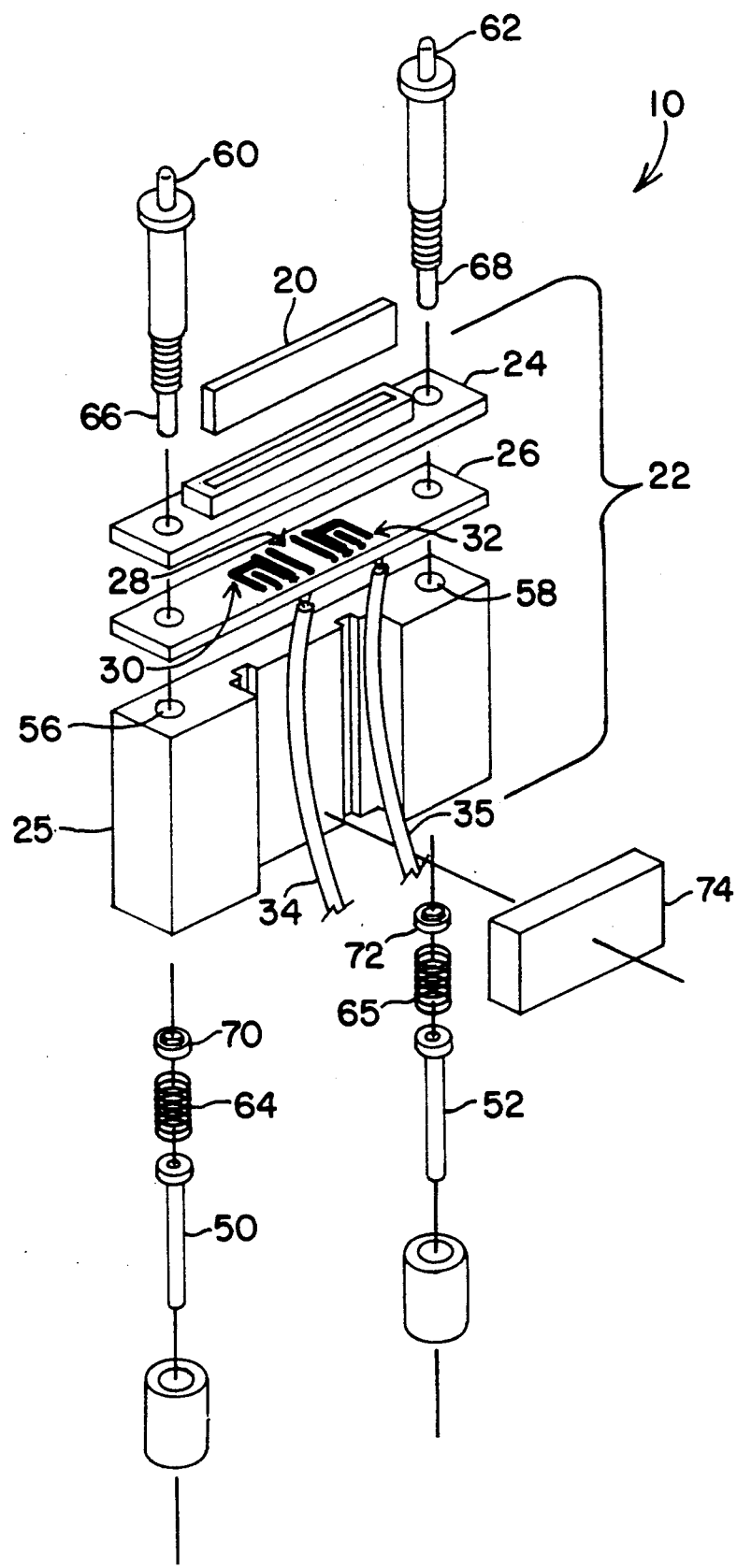
FIG. 2 is an exploded view of the electrical connector further disclosing the respective parts and their arrangement including the "footprint" of the first and third sets of electrical contact pads formed on a separate PC board.

The electrical connector 10 according to the invention is illustrated in FIGS. 1 and 2. In FIG. 1 the electrical connector is shown in a fragmentary environmental view between first and second circuit boards, for example a pin electronics card (PEC) 12 and a DUT loadboard 14. The loadboard 14 is formed with a set of loadboard electrical contact pads 15 joined to printed circuit leads providing electrical paths to pins of a DUT not shown. The DUT loadboard 14 is also formed with alignment holes 16 hereafter further described.

Referring also to the exploded view of FIG. 2, the electrical connector 10 includes an elastomeric material conductor 20 of elongate rectangular block configuration. The elastomeric conductor 20 is mounted and retained in position by a compression mounting assembly 22. The compression mounting assembly 22 includes a compression stop plate 24 of insulating material which aligns and retains the elastomeric conductor 20 and prevents overcompression of the elastomeric connector. The compression mounting assembly 22 also includes a floating spring loaded block 25 which spring biases the compression mounting assembly and in particular PC board 26 and compression stop plate 24 for compressing the elastomeric conductor 20.

The printed circuit board is formed with a set of PEC electrical contact pads 28 which are complementary to and match the loadboard electrical contact pads 15 formed on DUT loadboard 14. The compression stop plate 24 is of annular configuration so that the elastomeric electrical conductor 20 is exposed at both top and bottom ends. The elastomeric electrical conductor 20 therefore contacts respectively both sets of electrical contact pads 15, 28 and establishes compressible electrical connector paths between the respective pads of the sets of electrical contact pads 15, 28. Electrical continuity is therefore established between the PEC 12 and a DUT, not shown, mounted on DUT loadboard 14.

The elastomeric conductor 20 is composed for example of PCK (TM) elastomeric conductor materials available from Elastomeric Technologies, Inc., 2940 Turnpike Drive, Hatboro, Pa. 19040. Such elastomeric conductor materials are composite materials of a compressible elastic elastomer formed with internal gold wires that make separate electrical connection between the ends of a block of the elastomeric material. Corresponding complementary and aligned electrical contact pads from the respective sets of electrical contact pads 15, 28 at opposite ends of the elastomeric conductor 20 are therefore separately electrically connected. The internal gold wire conductors provide very low resistance connection and provide good electrical contact at the respective contact pads. The spacing between separate gold wires in the elastomer is referred to as the "pitch" of the composite material and may be selected according to the application to establish separate electrical connections for example between the different respective contact pads of the two sets 15, 28.

Figure 3A:
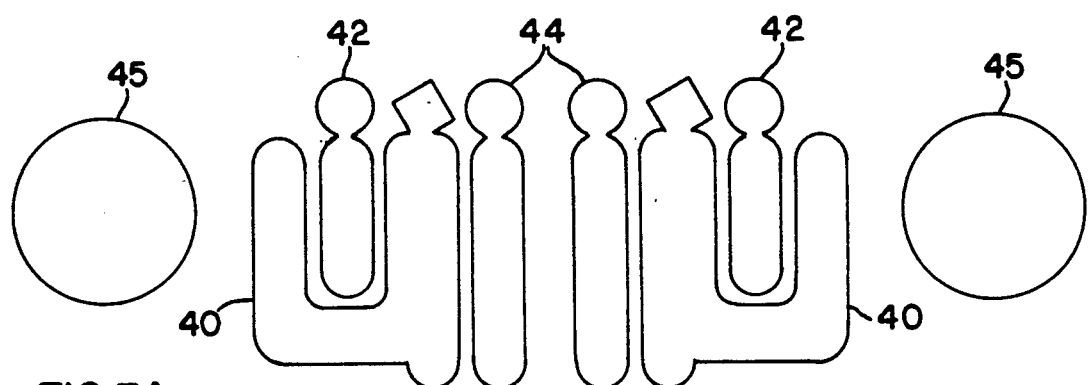
FIG. 3A is a detailed fragmentary plan view of a pair of electrical contact pad "footprints" approximating coaxial cable transmission line footprints in two dimensions according to the invention.
Figure 3:
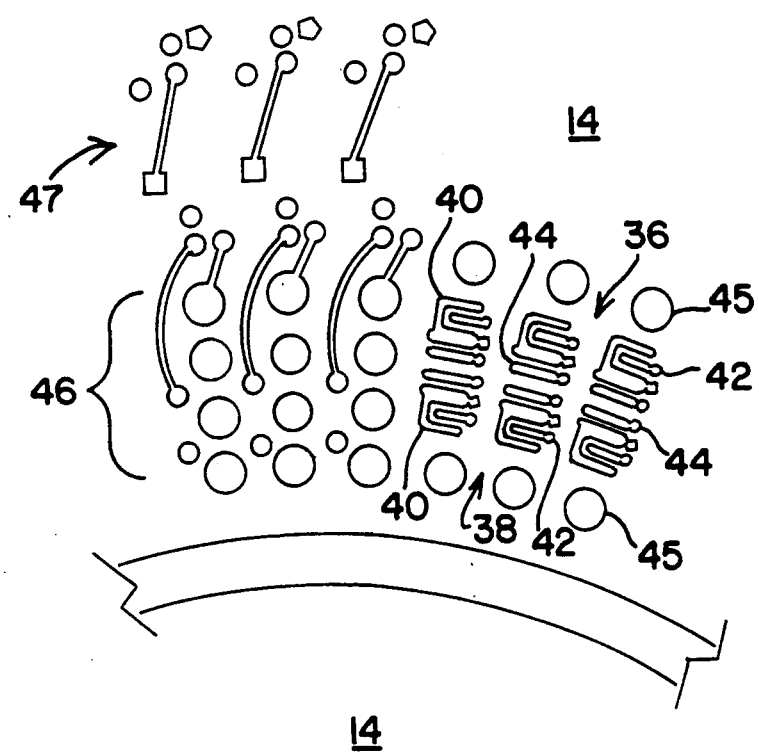
FIG. 3 is a fragmentary plan view of a pie shaped sector of the DUT loadboard showing the "footprint" of the second and fourth sets of electrical contact pads according to the invention formed on the DUT loadboard and adjacent sets of prior art electrical contact pads combined on the same DUT loadboard.
Figure 3:
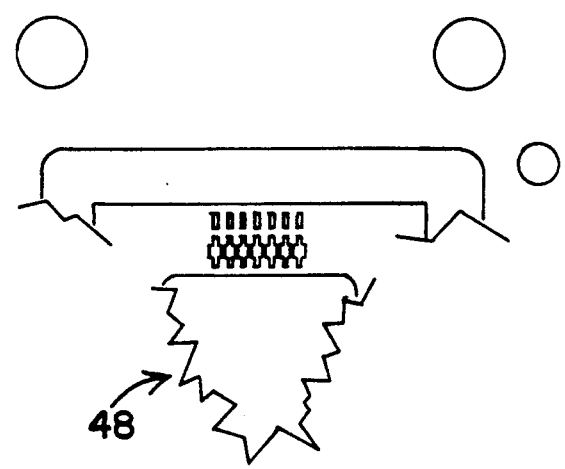

The "footprint" of the two sets of electrical contact pads 15, 28, on the DUT loadboard 14 and the PC board 26 respectively is shown in further detail in FIG. 3 and FIG. 3A. Each "set" of electrical contact pads for each PEC is actually two sets of contact pads for establishing electrical continuity for two separate test electrical paths between the PEC and a DUT. This is convenient for testing bus type ECL devices in the bus mode and differential output ECL devices in the complementary output mode as fully set forth and described in related copending U.S. Pat. Application Ser. No. 07/639,823 filed on the same date and entitled PIN ELECTRONICS TEST CIRCUIT FOR IC DEVICE TESTING, inventor, William H. Morong III. As a result, the two sets of electrical contact pads 28 formed on PC board 26 may be referred to herein as first and third sets 30, 32, while the two sets of electrical contact pads 15 formed on DUT loadboard 14 may be referred to as the second and fourth sets 36, 38. The first and second sets are electrically interconnected by elastomeric conductor 20 and the third and fourth sets are also electrically interconnected by elastomeric conductor 20.

As shown in FIGS. 2, 3 and 3A, the "footprint" of each of the first and third and second and fourth sets of electrical contact pads, approximates to the extent feasible in two dimensions, the footprint of a coaxial cable transmission line. The first and third sets 30, 32 on the PC board 26 of FIG. 2 are in fact connected respectively to separate first and second electrical paths or printed circuit traces on PEC 12 by coaxial cable transmission line segments 34, 35. The electrical connector construction therefore achieves a substantially constant impedance path, of for example 50 Ω between the PEC 12 and DUT loadboard 14.

Referring in more detail to FIGS. 3 and 3A, each of the second and fourth sets 36, 38 of electrical contact pads includes a "U" shaped pad 40 which approximates the coaxial ground lead, and line configuration pads 42, 44 respectively inside and outside but adjacent to the "U" shaped pad ground lead. The line pads 42 are used for example for the test signal leads for forcing or driving test signals from the PEC to a DUT. The line pads 44 are used, for example for pin signal leads for receiving and measuring pin signals passing from the DUT to the PEC. The circular holes 45 provide the alignment holes 16 on the DUT loadboard 14 as shown in FIG. 1 and hereafter further described.

The DUT loadboard 14 of the present invention differs from conventional DUT loadboards in the unique footprint of the electrical contact pads approximating the footprint of a coaxial cable. It also differs from conventional loadboards in providing two separate sets of electrical contact pads, e.g. 36,38 for each PEC for electrical continuity between two different test signal electrical paths for testing high speed ECL devices in the bus mode and in the differential output or complementary mode. An example of a conventional loadboard with only one set of simple circle or "dot" pads 46 for each PEC, for example for testing TTL devices, is the ESH (TM) loadboard of ESH, Inc., P.O. Box 26470, Tempe, Ariz. 85282. The simple circle or dot configuration pads are used with "Pogo Pin" (TM) electrical connectors and require adjacent relay connector lines and pads 47. The loadboard 14 of the present invention may combine sets of electrical contact pads according to such prior art devices and electrical contact pads according to the present invention for example for testing either TTL or ECL IC devices. This combination is illustrated in the DUT loadboard 14 of FIG. 3. In this fragmentary sector illustration of a DUT loadboard, the DUT is mounted in a socket 48 at the center of the DUT loadboard 14.

The electrical connector 10 is mounted on the PEC 12 at a fixed location on stationary pins 50,52. The pins 50,52 are secured to the PEC by pin anchors 54,55. The upper ends of fixed pins 50,52 extend into the lower end of alignment channels 56,58 formed through the floating block 25. Spring loaded block 25 is movably mounted on the stationary ends of the fixed pins 50,52. Alignment pins 60,62 are secured in fixed relation to the other ends of the alignment channels 56,58 formed in floating block 25. Alignment pins 60,62 also pass through respective alignment holes in the compression stop holder 24 and PC board 26 aligning and joining the respective components together to form the compression mounting assembly 22.

The fixed pins 50,52 and alignment pins 60,62 at respective ends of the alignment channels 56,58 define elongate spaces in the channels 56,58 in which are housed the mechanical helical springs 64,65. The mechanical springs 64,65 spring load or spring bias the compression mounting assembly 22 for compressing the elastomeric conductor 20 between the sets of electrical contact pads 28,15. Alignment pins 60,62 align the compression mounting assembly 22 with the DUT loadboard 14 through alignment holes 16 in the loadboard 14 to assure that electrical connections are made between respective corresponding electrical contact pads from the sets 28,15 despite warpage or misalignment of the circuit boards 12,14.

Alignment pins 60,62 are formed with ends 66,68 of reduced diameter which extend into the springs 64,65 through spring abutting washers 70,72 to assist in orienting the helical springs. The springs are therefore retained under tension between the fixed pins 50,52 secured to the PEC 12 and the washers 70,72 abutting against the alignment pins 60,62 of the moveable compression mounting assembly 22. An additional feature of the compression mounting assembly may include a strain relief bar 74 to take up strain on the spring loaded block resulting for example from board warpage or misalignment.

Importantly the spring loaded suspension system of the electrical connector 10 yields a high mechanical compliance so that the electrical connector can accommodate significant change of relative position of the DUT loadboard and PEC, due for example to board warpage or misalignment. At the same time, relatively high frequency signal conducting, relatively low inductance, and substantially constant impedance compressible electrical paths are maintained in alignment between the respective electrical contact pads of the sets 28,15 for test signals and pin signals.

While the invention has been described with reference to particular example embodiments it is intended to include all modifications and equivalents within the scope of the following claims.

I claim:

1. An electrical connector for making electrical connections between first and second sets of electrical contact pads coupled respectively to first and second circuit boards and for mechanically coupling the first and second circuit boards substantially at right angle to each other comprising:

an elastomeric conductor providing a first set of relatively high frequency signal conducting compressible electrical paths between said first and second sets of electrical contact pads;

a compression mounting assembly including a holder mounting the elastomeric electrical connector between said first and second sets of electrical contact pads and in electrical contact with said first and second sets of electrical contact pads, said compression mounting assembly being coupled in a defined relationship to the first circuit board and comprising an intermediate third circuit board secured to the compression mounting assembly and being oriented substantially parallel to the second circuit board and substantially at right angles to the first circuit board, said second set of electrical contact pads being formed on the second circuit board, said first set of electrical contact pads being formed on the third circuit board for alignment with the second set of electrical contact pads, said first set of electrical contact pads being electrically connected by electrical leads to the first circuit board;

and mechanical spring means coupled to the electrical connector for spring loading the compression mounting assembly for compressing said elastomeric electrical conductor between the first and second sets of electrical contact pads, said mechanical spring means affording a relatively high mechanical compliance spring coupling between the first and second circuit boards in combination with the elastomeric electrical conductor for maintaining electrical connection through said compressible electrical connector paths over a range of relative change of position of the first and second circuit boards due to warpage or misalignment.

2. The electrical connector of claim 1 wherein the electrical connector is coupled to the first circuit board at a fixed position, wherein the electrical connector comprises first alignment means, and wherein the second circuit board comprises second alignment means complementary to the first alignment means for alignment of the first set of electrical contact pads, first set of compressible electrical connector paths, and second set of electrical contact pads for making said electrical connections.

3. The electrical connector of claim 2 wherein the first alignment means on the electrical connector comprises alignment pins and wherein the second alignment means on the second circuit board comprises alignment holes.

4. The electrical connector of claim 2 wherein the third circuit board comprises third alignment means complementary with said first alignment means of the electrical connector for aligning the first and second sets of electrical contact pads.

5. The electrical connector of claim 1 wherein the compression mounting assembly comprises a compression stop holder for holding the elastomeric electrical conductor and for limiting compression of the elastomeric electrical conductor, and a spring loaded block mechanically coupled to the compression stop holder, said mechanical spring means being coupled to the spring loaded block for spring biasing said block and in turn spring biasing the compression stop holder for compressing said elastomeric electrical conductor between the first and second sets of electrical contact pads.

6. The electrical connector of claim 5 wherein the third circuit board on which the first set of electrical contact pads is formed is interposed between the compression stop holder and spring loaded block, said compression stop holder being formed in annular configuration with a holder opening exposing the elastomeric electrical conducting means at both ends of the compression stop holder for respectively contacting the first and second sets of electrical contact pads.

7. The electrical connector of claim 6 wherein the electrical connector first alignment means comprises alignment pins and wherein the second circuit board and third circuit board comprise respectively second and third alignment means in the form of alignment holes complementary with the alignment pins for alignment of the first and second sets of electrical contact pads through said elastomeric electrical conductor.

8. The electrical connector of claim 6 wherein the third circuit board comprises a printed circuit board.

9. The electrical connector of claim 7 wherein the compression stop holder and spring loaded block are formed respectively with fourth and fifth alignment means comprising further alignment holes for alignment with said alignment pins of the electrical connector.

10. The electrical connector of claim 9 wherein the fifth alignment means of the spring loaded block comprises elongate channel alignment holes passing through said block, said electrical connector comprising fixed pins secured in stationary position on the first circuit board at one end of the fixed pins, said fixed pins being enclosed respectively at the other end of the fixed pins in one end of the elongate channel alignment holes, said alignment pins of the electrical connector being secured in the other ends of the elongate channel alignment holes defining elongate spaces in the elongate channel alignment holes between the respective fixed pins and alignment pins, and wherein the mechanical spring means comprises helical springs mounted in said elongate spaces, said compression stop holder, third circuit board, spring loaded block, and first alignment means of the electrical connector being movably mounted relative to the fixed pins of the electrical connector and being jointly spring loaded by the helical springs.

11. The electrical connector of claim 10 wherein the alignment pins comprise a length of reduced diameter extending through the helical springs for orienting said helical springs in said elongate spaces.

12. The electrical connector of claim 1 wherein the first and second sets of electrical contact pads comprise printed circuit traces in configurations approximating coaxial transmission line footprints for providing controlled impedance throughout the electrical connection made by the electrical connector.

13. The electrical connector of claim 12 wherein the first and second sets of electrical contact pads each comprise a "U" shape pad for ground electric connection, a first elongate line shaped pad within the "U" shaped pad, and a second elongate line shaped pad adjacent to the "U" shaped pad, said first and second elongate line shaped pads providing test signal and pin signal electrical connections.

14. The electrical connector of claim 2 comprising third and fourth sets of electrical contact pads coupled respectively to the first and second circuit boards separate from the first and second sets of electrical contact pads, said elastomeric electrical conductor providing a second set of compressible electrical connector paths between said third and fourth sets of electrical contact pads, said first and second alignment means providing alignment of the third set of electrical contact pads, elastomeric electrical conductor, and fourth set of electrical contact pads.

15. The electrical connector of claim 14 wherein the first, second, third, and fourth sets of electrical contact pads comprise printed circuit traces in configurations approximating coaxial transmission line footprints for providing controlled impedance through the electrical connection made by the electrical connector.

16. The electrical connector of claims 15 wherein the first circuit board is a pin electronics card (PEC), and wherein the second circuit board is an IC device under test (DUT) loadboard, said PEC and DUT loadboard being comprised in the test head of a computer controlled digital logic IC device tester.

17. The electrical connector of claim 16 wherein the first and third sets of electrical contact pads are mounted on the third circuit board separate from the first circuit board, said first and third sets of electrical contact pads being coupled to the first circuit board by transmission line couplings, said third circuit board being formed with third alignment means complementary with said first alignment means of the electrical connector for aligning the first and second sets of electrical contact pads and aligning the third and fourth sets of electrical contact pads.

18. An electrical connector for making electrical connections between a pin electronics card (PEC) and an IC device under test (DUT) loadboard comprised in the test head of a digital logic IC device tester and for mechanically coupling the PEC and DUT loadboard substantially at right angles to each other, said PEC comprising a test electrical first path, said DUT loadboard comprising a test electrical first path continuation, said electrical connector making electrical connections between a first set of electrical contact pads electrically coupled to the PEC test electrical first path and a second set of electrical contact pads electrically coupled to the DUT loadboard test electrical first path continuation for conducting test signals and pin signals between the PEC and a DUT mounted on the DUT loadboard, said electrical connector comprising:

an elastomeric electrical conductor providing a first set of relatively high frequency signal conducting compressible electrical connector paths between said first and second sets of electrical contact pads;

a compression mounting assembly including a holder mounting the elastomeric electrical conductor between said first and second sets of electrical contact pads and in electrical contact with the first and second sets of electrical contact pads, said compression mounting assembly being coupled in a defined position with respect to the PEC and comprising an intermediate third circuit board mounted and oriented substantially in parallel with the DUT loadboard and substantially at right angles to the PEC, said second set of electrical contact pads being formed on the second circuit board, said first set of electrical contact pads being formed on the third circuit board for alignment with the second set of electrical contact pads, said first set of electrical contact pads being electrically connected to the first circuit board by electrical leads;

and mechanical spring means coupled to the electrical connector for spring loading the compression mounting assembly for compressing said elastomeric electrical conductor between the first and second sets of electrical contact pads, said mechanical spring means adding a relatively high mechanical compliance spring coupling between the first and second circuit boards in combination with the high frequency signal conducting elastomeric electrical conductor for accommodating relative motion between the first and second circuit boards due to warpage or misalignment.

19. The electrical connector of claim 18 wherein the electrical connector is coupled to the PEC at a fixed position, wherein the electrical connector comprises first alignment means, and wherein the DUT loadboard comprises second alignment means complementary with the first alignment means for alignment of the first set of electrical contact pads, first set of compressible electrical connector paths, and second set of electrical contact pads for making said electrical connections.

20. The electrical connector of claim 19 wherein said third circuit board is formed with third alignment means complementary with the first alignment means of the electrical connector for aligning the first and second sets of electrical contact pads.

21. The electrical connector of claim 19 further comprising third and fourth sets of electrical contact pads coupled respectively to the PEC and DUT loadboard separate from the first and second sets of electrical contact pads, said PEC being formed with a test electrical second path coupled to the third set of electrical contact pads, said DUT loadboard being formed with a test electrical second path continuation coupled to the fourth set of electrical contact pads, said elastomeric electrical conductor providing a second set of compressible electrical connector paths between said third and fourth sets of electrical contact pads, said first and second alignment means providing alignment of the third set of electrical contact pads, second set of compressible electrical connector paths, and fourth set of electrical contact pads.

22. The electrical connector of claim 21 wherein the first, second, third, and fourth sets of electrical contact pads comprise printed circuit traces in configurations approximating coaxial transmission line footprints for providing controlled impedance through the electrical connections made by the electrical connector.

23. The electrical connector of claim 21 wherein the compression mounting assembly means comprises a compression stop holder for holding the elastomeric electrical conductor and for limiting compression of the elastomeric electrical conductor, and a spring loaded block mechanically coupled to the compression stop holder, said mechanical spring means being coupled to the spring load block for spring biasing said block and in turn spring biasing the compression stop holder for compressing said elastomeric electrical conductor between the first and second sets of electrical contact pads and between the third and fourth sets of electrical contact pads.

24. The electrical connector of claim 23 wherein the first and third sets of electrical contact pads are mounted on the third circuit board, separate from the PEC, said first and third sets of electrical contact pads being coupled to the PEC by transmission line couplings, and wherein the third circuit board separate from the PEC is interposed between the compression stop holder and spring loaded block, said compression stop holder being of annular configuration exposing the elastomeric electrical conducting means at both ends of the compression stop holder for respectively contacting at one end the first and third sets of electrical contact pads formed on the third circuit board and the second and fourth sets of electrical contact pads coupled to the DUT loadboard.

25. The electrical connector of claim 24 wherein the second and fourth sets of electrical contact pads are formed directly on the DUT loadboard.

26. The electrical connector of claim 25 wherein the first alignment means on the electrical connector comprises alignment pins and wherein the second and third alignment means on the DUT loadboard and third circuit board comprise alignment holes;

wherein the compression stop holder and spring loaded block are formed respectively with fourth and fifth alignment means comprising further alignment holes for alignment with said alignment pins of the electrical connector;

and wherein the fifth alignment means of the spring loaded block comprises elongate channel alignment holes passing through said block, said electrical connector comprising fixed pins secured in fixed position on the PEC at one end of the fixed pins and enclosed at the other end of the fixed pins in one end of the elongate channel alignment holes, said alignment pins of the electrical connector being secured in the other ends of the elongate channel alignment holes defining elongate spaces in the elongate channel alignment holes between the respective fixed pins and alignment pins;

said mechanical spring means comprising helical springs mounted in the elongate spaces in the elongate channel alignment holes.

27. The electrical connector of claim 26 wherein the third circuit board comprises a printed circuit board.

28. The electrical connector of claim 22 wherein the first, second, third and fourth sets of electrical contact pads each comprise a "U" shaped pad for ground electrical connection, a first elongate line shaped pad within the "U" shaped pad, and a second elongate line shaped pad adjacent to the "U" shaped pad, said first and second elongate line shaped pads providing test signal and pin signal electrical connections.

* * * * *